United States Patent [19]

Shoji et al.

[11] Patent Number: 5,051,800

[45] Date of Patent: Sep. 24, 1991

[54] THIN FILM SEMICONDUCTOR DEVICE AND LIQUID CRYSTAL DISPLAY APPARATUS USING THEREOF

[76] Inventors: Hajime Shoji, 1-2-43, Wakaehigashimachi, Higashiosaka-shi, Osaka; Noriko Watanabe, 5-8, Sanjo-soekawa-cho, Nara-shi, Nara-ken; Hiroshi Hamada, 177, Aoyama 7-chome, Nara-shi, Nara-ken; Hiroaki Kato, 9-4, Tezukayama 1-chome, Nara-shi, Nara-ken; Toshio Takemoto, 134-5, Fujiwaradai, Nara-shi, Nara-ken; Toshihiko Hirobe, 2-20-604, Ohama-nakamachi 1-cho, Sakai-shi, Osaka-fu, all of Japan

[21] Appl. No.: 344,609

[22] Filed: Apr. 28, 1989

[30] Foreign Application Priority Data

Apr. 30, 1988 [JP] Japan ................................ 63-108697
Jul. 7, 1988 [JP] Japan ................................ 63-169792

[51] Int. Cl.$^5$ .......................................... H01L 27/14
[52] U.S. Cl. ................................. 357/30; 357/23.7; 357/2; 350/339 R; 350/342; 350/338; 350/336
[58] Field of Search ............... 357/23.7, 2, 30 I, 30 G, 357/30 H, 30 K, 30 L, 59 G, 4; 350/336, 338, 339 R, 342

[56] References Cited

U.S. PATENT DOCUMENTS

| | | | |
|---|---|---|---|
| 4,065,781 | 12/1977 | Gutknecht | 357/23.7 X |
| 4,425,572 | 1/1984 | Takafuji et al. | 357/23.7 X |
| 4,599,246 | 7/1986 | Harajiri et al. | 427/86 |
| 4,601,097 | 7/1986 | Shimbo | 29/572 |
| 4,822,751 | 4/1989 | Ishizu et al. | 357/23.7 X |

FOREIGN PATENT DOCUMENTS

| | | |
|---|---|---|
| 0136509 | 4/1985 | European Pat. Off. |
| 0179914 | 4/1985 | European Pat. Off. |
| 0179915 | 4/1985 | European Pat. Off. |
| 0196915 | 10/1986 | European Pat. Off. |

Primary Examiner—William Mintel

[57] ABSTRACT

A thin film semiconductor device and a liquid crystal display apparatus is provided wherein the thin film semiconductor device having light irradiated thereon is cut off by a conductor layer, and the light can be prevented from reaching the semiconductor layer. As a result, the generation of carriers due to optical excitation does not occur and the off current of the device can be reduced. Because there is no area where the electric field intensity in an opposed direction to the source electrode and the drain electrode is weaker than the electric field intensity of the channel region in the semiconductor layer, even after operating the device for a prolonged duration under the irradiation of light, carriers generated by optical excitation are not accumulated in the semiconductor layer, and the probability of trapping the carriers into a gate insulating film is quite low, and therefore variations in the characteristics of the thin film semiconductor device are negligibly small. The liquid crystal display apparatus using the thin film semiconductor can restrict such deteriorations of display quality such as the degradation of contrast and uniformity.

4 Claims, 7 Drawing Sheets

THIN FILM SEMICONDUCTOR DEVICE AND LIQUID CRYSTAL DISPLAY APPARATUS USING THEREOF

BACKGROUND OF THE INVENTION

1. Field of the Invention

The invention relates to a thin film semiconductor device and more particularly to a thin film semiconductor device used in switching element or the like which is provided to each picture element electrode in an active matrix type liquid crystal display apparatus, and further to a liquid crytal display appratus which utilizes the thin film semiconductor device.

2. Description of the Related Art

An active matrix drive systems has been adopted to drive a liquid crystal display apparatus. This drive system drives a liquid crystal by providing a switching element and, as required, a signal storage element to each picture element electrode, which are integrated into a single device. In a liquid crystal display apparatus of the drive system mentioned above, a thin film transistor (abbreviated as TFT,) or the like is provided as a switching element in the vicinity of each picture element electrode, and a gate electrode and a source electrode cross each other to provided an XY matrix. To the gate electrode, a control signal for switching TFT is applied and to the source electrode, a signal corresponding to information for displaying (hereafter referred to as a display signal) is applied, for driving the thin film transistor and for applying a display signal voltage across to each picture element electrode connected to a drain electrode and a counter electrode opposing thereto. Thereby, the displaying status of the liquid crystal display element is controlled.

FIG. 1 is a plan view of the vicinity of conventional thin film semiconductor device, and FIG. 2 is a cross-sectional view taken along a line II—II of FIG. 1. Referring to FIG. 2, the construction of the conventional thin film semiconductor device 100 will be explained. In the thin film semiconductor device 100, a thin film transistor includes a gate electrode 101, a semiconductor layer 103 made of amorphous silicon film which is formed over a gate insulating film 102 and the gate electrode 101, a protective insulator film 104 formed over the semiconductor layer, n+ type semiconductor layers 105a and 105b made phosphorus-doped n+ amorphous silicon film or the like which are formed over both the semiconductor layer 103 and the protective insulator film 104, and a source electrode 106 and a drain electrode 107 formed on the n+ type semiconductor layers 105a and 105b respectively. The thin film transistor is formed on an electrically insulating substrate 109 which is transparent, and the drain electrode 107 is connected to a picture element electrode 108.

The conventional thin film transistor is formed so that the semiconductor layer extends beyond the edge of the gate electrode as illustrated in FIG. 1. As a result, the risk of the leakage which may occur between the gate and the source at the side wall of the gate edge a from a damage to the gate insulating film during patterning of the n+ type semiconductor layer is reduced. According to the construction of the conventional thin film transistor, it is obvious that problems such as the leakage between the gate and source due to damage of the gate insulating film does not occur.

In a liquid crystal display apparatus of the conventional active matrix drive system, the signals are applied to the gate electrode and the source electrode for driving the thin film transistor located at each intersection and for controlling the current flowing between the source electrode and the drain electrode. Thereby, and therey optical characteristics such as rotatory power and transmissivity of the liquid crystal display element, are controlled. The presence of a defect of the ON/OFF switching characteristics in the multitude of thin film transistors provided in the display region will cause deterioration of the display quality such as degradation of the contrast and the uniformity. One of the causes of this defect is from an increase in the off current. The off current refers to the leakage current flowing when the thin film transistor is kept off by setting the gate to a low level. The leakage current is caused by the carriers generated in the semiconductor layer of the thin film transistor by thermal excitation and optical excitation, for example.

In an experiment with a transmission type liquid crystal display apparatus formed of the thin film semiconductor 100 illustrated in FIG. 1, it has been confirmed that the light emitted by a light source 110 provided at a side of the substrate 109 opposite to the side where the thin film transistors are formed is irradiated onto the semiconductor layer 103 which is formed to extend beyond the gate electrode 101 on the left and right as illustrated in FIG. 2 for generating the carriers by optical. Thereby an increase the off current results. Namely, the problem arises from the fact that light irradiates the semiconductor layer 103 because the width L2 of the semiconductor layer 103 is larger than the width L1 of the gate electrode 101.

FIG. 3 is a plan view of another conventional thin film semiconductor device 111 and FIG. 4 is a cross-sectional view taken along a line IV—IV of FIG. 3. Referring to FIG. 3 and FIG. 4, this conventional semiconductor device 111 will be explained. Over an electrically insulating substrate 112 is formed a gate electrode 113 made of chromium, tantalum or the like. Furthermore a gate insulating film 114 made of silicon nitride, tantalum pentoxide, silicon dioxide or the like is formed for insulating relating the gate electrode 113 from other electrodes.

On the gate insulating film 114 which covers the gate electrode 113, a semiconductor layer 115 made of amorphous silicon, which may be a channel region of the thin film transistor 111, is formed. Over the semiconductor layer 115 is stacked a protective insulator layer 116 made of silicon nitride or the like which is formed so that the central part remains after photo-etching or the like. On the part of the semiconductor layer 115 where the protective insulator film 116 has been removed, n+ type semiconductor layers 117a and 117b having electrons as majority carriers formed by phosphorus doping, for the purpose of forming a source electrode and a drain electrode. Also n+ type semiconductor layer 117a and 117b cover each edge of the protective insulator film 116, and are arranged to oppose without making contact with each other on the protective insulator film 116. One side of the semiconductor layer 115 is completely covered with both the protective insulator film 116 and the n+ type semiconductor layers 117a and 117b. Thus the thin film transistors are formed over the substrate 112.

On one of the n+ type semiconductor layers 117a and 117b is formed a source electrode 118 and on the other layer is formed a drain electrode 119. These electrodes are made of chromium, titanium, molybdeunm, aluminium or the like. An opposite end to the n+ type semiconductor 117b of the drain electrode 119 is electrically connected to the picture element electrode 120 of the liquid crystal display element. Moreover, both the drain electrode 119 and the picture element electrode 120 may be permitted to be integrated with the transparent electrode made of indium tin oxide or the like.

In the following explanation, a direction L and a direction W will be defined as follows. A direction L is (1): an opposed direction of the source electrode and the drain electrode, (2): a direction of the a channel of current between the source electrode and the drain electrode, and (3): a direction crossing the gate electrode. The direction L of both the conventional embodiment and an embodiment as described blow in the present application satisfies the definitions (1), (2), and (3). Moreover, the direction W is perpendicular to the direction L.

In the conventional structure illustrated in FIG. 3, for the protective insulator film 116, the n+ type semiconductor layers 117a and 117b and the source and drain electrodes 118 and 119 in the direction W perpendicular to the direction where the n+ type semiconductor layer 117a and 117b oppose each other, namely in the lengthwise direction of FIG. 3, the widths W1, W2 and W3 are selected to satisfy the following relation.

$$W1 \geq W2 > W3 \tag{1}$$

Where W1 is the width of the contact region between the semiconductor layer and the n+ type semiconductor layer, W2 is the width of the channel region, and W3 is the width of the source electrode and the drain electrode, respectively.

In the usual operation of the liquid crystal display, light for illumination is irradiated from, the opposite side of the substrate 112.

FIG. 5 illustrate a graph of the gate-drain voltage Vgd vs. the drain current Id characteristic. In an initial condition, namely under a dark condition before operating for a prolonged duration under the radiation of light, the gate-drain voltage Vgd vs. the drain current Id characteristic is indicated by the solid line 111 of FIG. 5. Further more the gate-drain voltage Vgd vs. the drain current Id characteristic is measured under a condition where the carriers have been generated in the semiconductor layer 115 by the irradiation of light, and indicates that the characteristic when the TFT is off varies from the solid line 111 of FIG. 5 to the dashed line 112. The degree of the variation of the off characteristic is dependent on the luminous intensity. If the operating time under the radiation of light were comparative by short enough, the variation between the characteristic 111 and the characteristic 112 would be reversed. Therefore, after the radiation of light pauses the Vgd-Id characteristic measured under a dark condition will revert again to the characteristic shown by the line 111.

On the other hand, after operating for a prolonged duration under the radiation of light, the Vgd-Id characteristic shifts to a negative direction of Vgd as represented by the solid line 113 under a dark condition and by the dashed line 114 under the radiation of light. The scale of shift is dependent on the liminous intensity and the operating duration under the radiation of light. Therefore, as the luminous intensity is increased and the operating duration under the radiation of light is prolonged, the shift is larger. The mechanism of this phenomenon will be explained as follows.

When the light is irradiated from another side of the substrate 112, because the gate insulating film 114 is transparent, the light reaches the region in the semiconductor layer 115 where the light is not cut off by the gate electrode 113. The energy of this light will generate the carriers which include electron-hole pairs in the semiconductor layer 115. In this condition, namely after operating for a prolonged duration under the radiation of light, in the region A, where the electric field intensity in the direction between the source and the drain electrodes is weak, as indicated by the cross hatched area in FIG. 3, the drift time for the carriers the (running time in the channel) will be longer than the drift time in the channel region where the intensity is strong. Therefore the probability of trapping the carriers into the gate insulating film 114 by the gate-drain voltage Vgd applied to the gate electrode 114 will be high. Accordingly, the threshold voltage Vth will be shifted by the trapped carriers.

In the configuaration of the thin film semiconductor device 111 which is operated for a prolonged duration under the irradiation of light, the switching element will not be completely turned off even when the gate-drain voltage Vgd is so controlled that the switching element is turned off to reserve the carriers accumulated between the display element electrode 120 and the counter electrode. Therefore the effective voltage applied to the liquid crystal layer will decay, and the display quality may become uneven or the contrast may become weaker.

In other words, as the functional quality of the thin film semiconductor 111 degrades, the reliability of the liquid crystal display element which incorporates the thin film semiconductor 111 is reduced.

FIG. 6 is a plan view of another conventional thin film transistor, where the reference symbols which are the symbols in FIG. 3 represent parts identical or corresponding to symbols in FIG. 3. A cross-sectional view taken along a line IV—IV in FIG. 6 is the same as the view in FIG. 4. The differences from the thin film semiconductor device 111 of FIG. 3 are the shape of the semiconductor layer 115 and the size of both the protective insulator film 116 and the n+ type semiconductor layers 117a and 117b. In the protective insulator film 116, the n+ type semiconductor layers 117a and 117b and the source and the drain electrodes 119, 119 in FIG. 6, and the widths W1, W2 and W3 in the same direction as the direction illustrated in FIG. 3 are selected to satisfy the relation:

$$W2 \geq W1 > W3. \tag{2}$$

In other words, W1 is the width of the contact region between the semiconductor layer and the n+ type semiconductor layer, W2 is the width of the channel region, and W3 is the width of both the source electrode and the drain electrode.

In the thin film semiconductor device of the configuration illustrated in FIG. 6, there exists an area A indicated by the cross hatched area where the electric field intensity in the direction between the source and the drain electrodes is weak. Therefore when the device is operated for a prolonged duration under the irradiation of light, the probability will be high for the, carriers to be generated in the semiconductor layer 115 and being trapped into the gate insulating film in the area A where the electric field intensity in the direction between the source and the drain electrodes is weak. These trapped carriers cause a shift in the gate-drain voltage Vgd vs. drain current Id characteristic similar to the case of the thin film semiconductor device 111 of FIG. 4, which results in the degradation of the functional quality of the thin film semiconductor device. This also causes the reliability of the device to be poor.

The models used for the explanation of the undesirable phenomenon in the conventional devices as described above have been conducted by an inventor of the present application and the influence of the light in various shaped TFTS. was examined. Therefore, on the basis of this experiments the embodiments of the present invention propose satisfactory solutions to the problems of the conventional devices.

SUMMARY OF THE INVENTION

The first object of the present invention is to provide a thin film semiconductor device, which is capable of decreasing the off current caused by the generation of carriers through optical excitation and decreasing the shift of threshold voltage Vth, and a liquid crystal display apparatus which uses the thin film semiconductor device.

In order to achieve thin object, the thin film semiconductor device of this invention comprises:

an electrically insulating substrate having a first surface and a second surface where the light is at least transmitted from the second surface to the first surface;

a conductor layer which is formed on the first surface and is cut off from the light;

an insulator layer formed which covers the surface of the conductor layer; and a semiconductor layer which is formed on the insulator layer and has a width smaller than the width of the conductor layer, and thereby the light is cut off at the conductor layer when the light is irradiated from the second surface of the electrically insulating substrate.

According to the invention, in an electrically insulating substrate having a first surface and a second surface where light is transmitted at least from the second surface to the first surface, a conductor layer which does not transmit light on the first surface is formed. On the conductor surface is formed an insulator layer and on the electrically insulating film a semiconductor layer is formed which has a width in the direction L that is smaller than that width of the conductor layer.

According to the invention, when light from the side of the second surface of the electrically insulating substrate is irradiated, the light is cut off at the conductor layer and therefore is not irradiated onto the semiconductor layer. Consequently, carriers are not generated by optical excitation and the off current caused by the carriers can be substantially reduced. Furthermore, it the shift of the threshold voltage Vth decreases to a level which is negligible in usual operations when the device is operated for a prolonged duration under the radiation of light.

In a preferred embodiment, a pair of electrodes separated by a gap is formed on the semiconductor layer.

In another preferred embodiment, the lengths of each electrode for a pair of electrodes in the direction W perpendicular to the direction L, where the electrodes of the pair oppose each other, are selected to be equal to or larger than the length of a channel region in the semiconductor layer in the direction W.

In a further preferred embodiment, the pair of electrodes are a source electrode and a drain electrode, the conductor layer is a gate electrode, and these electrodes and the semiconductor layer comprise a thin film transistor.

According to the invention, in a liquid crystal display apparatus where the row electrodes and the column electrodes, which are mutually insulated, are formed on an electrically insulating substrate and a thin film semiconductor device is provided at each intersection of the row electrodes and the column electrodes, the thin film semiconductor device comprises:

an electrically insulating substrate having a first surface and a second surface where light is transmitted at least from the second surface to the first surface.

A conductor layer which is formed on the "one surface" and is cut off from the light;

an insulator layer; formed on the conductor layer and

A semiconductor layer which is formed on the insulator layer and has a width in the direction L which is smaller than the width of the conductor layer, and thereby the light is cut off at the conductor layer when light is irradiated from the side of the second surface of the electrically insulating substrate.

According to the invention, a thin film semiconductor device having the configuration previously described is located at each intersection of the row electrodes and the column electrodes which are formed while being mutually insulated on the electrically insulating substrate of the liquid crystal display apparatus.

According to the invention, because a thin film semiconductor device of high quality can be provided, the display quality of the liquid crystal display apparatus is greatly improved.

In a preferred embodiment for such a thin film semiconductor device, the lengths of the source electrode and the drain electrode in the direction W perpendicular to the opposing direction L of these electrodes are selected to be equal to or larger than the length of the channel region in the semiconductor layer in the direction W, are formed for the liquid crystal display apparatus.

In a further preferred embodiment, the liquid crystal display apparatus is a transmission type liquid crystal display apparatus which provides a light source at the side of the second surface of the substrate.

The second object of the invention is to provide a thin film semiconductor device which does not accumulate carriers generated by the optical excitation in the semiconductor layer and is thereby capable of preventing the deterioration of the quality of a liquid crystal display apparatus using the thin film semiconductor device for improving the reliability thereof.

In order to achieve this object, the invention provides a thin film semiconductor device having a gate electrode, an insulator layer and a semiconductor layer stacked in tthis order on an electrically insulating substrate, with a source electrode and a drain electrode separated by a gap formed on the semiconductor layer. In the thin film semiconductor device where the lengths of the source electrode and the drain electrode in the direction W perpendicular to the direction L for these electrodes opposing to each other are selected to be equal to or larger than the length of the channel region in the semiconductor layer in the direction W.

According to the invention, the thin film semiconductor device is made by stacking the gate electrode, the insulator layer and the semiconductor layer in this order, and a source electrode and a drain electrode are formed to be separated by a gap on the semiconductor layer. The lengths of the source electrode and the drain electrode in the direction W perpendicular to the direction L where these electrodes oppose each other are selected to be equal to or larger than the length of the channel region in the semiconductor layer in the direction W.

According to the invention, there is no area in the semiconductor layer where the electric field intensity in the direction between the source and drain electrodes is weaker than the electric field intensity in the channel region. Therefore, even after operating under irradiation of light for a prolonged duration, a traveling time for passing the carriers generated by the irradiation of light through the semiconductor layer is short. Consequently, because the probability of the carriers being trapped in the insulator layer is also quite low, the shift in the characteristic of the thin film semiconductor device caused by the carriers is negligibly small. Therefore, the deterioration of the functional quality of the semiconductor device can be prevented and the reliability of the thin film semiconductor device is improved.

The present invention will become more fully understood from the detailed description given herein below and the accompanying drawings which are given by way of illustration only, and thus, are not limitative of the present invention, and wherein.

DETAILED DESCRIPTION OF THE PREFERRED EMBODIMENTS OF THE PRESENT INVENTION

Figure 7:
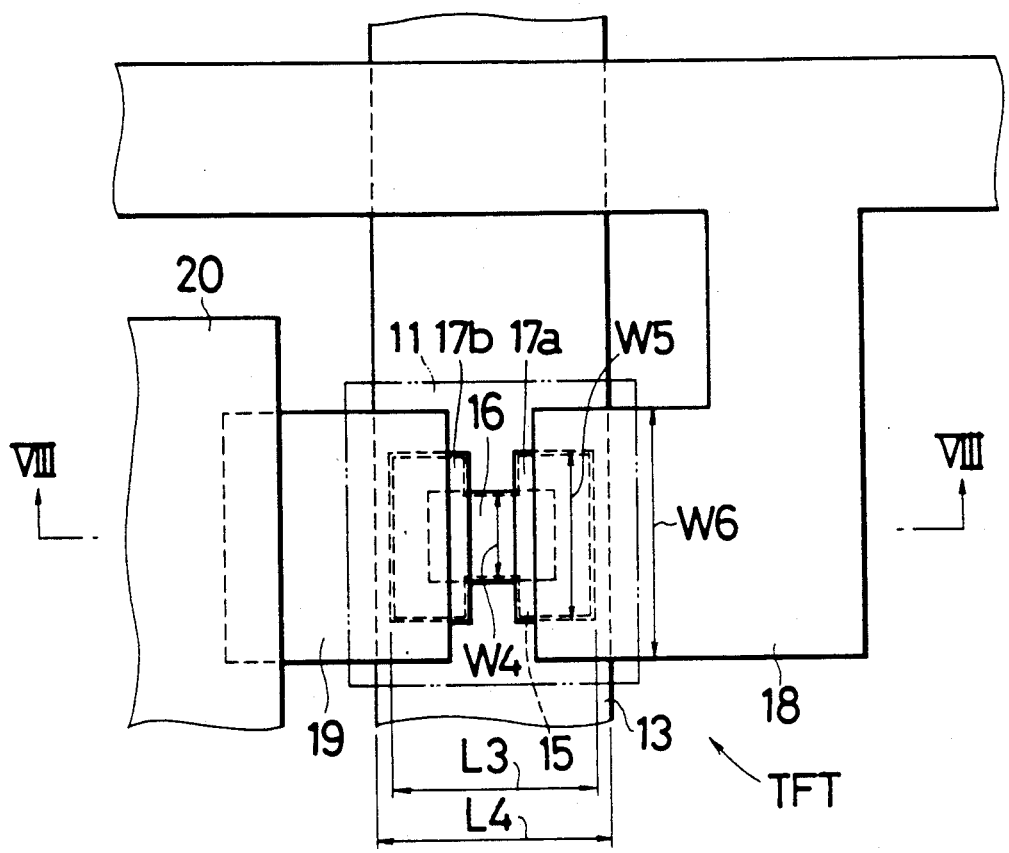
FIG. 7 is a plan view of a thin film semiconductor device for an embodiment of the present invention.
Figure 8:
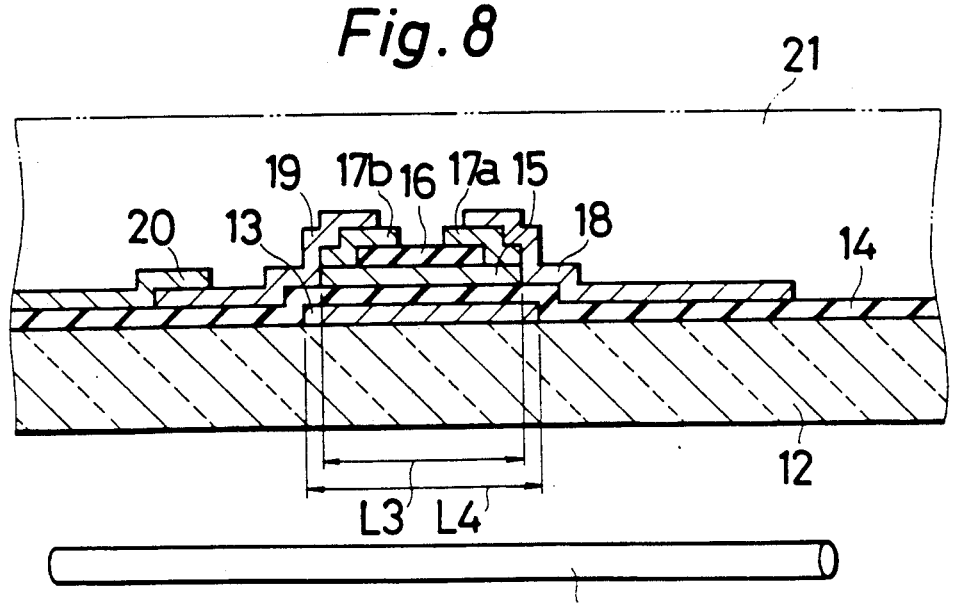
FIG. 8 is a cross-sectional view taken along a line VIII—VIII or FIG. 7.

Referring to FIG. 7 and FIG. 8, a thin film semi-conductor device for an embodiment of the present invention will be explained as follows.

Each film of the thin film semiconductor device explained hereinafter is usually patterned into a desired shape by conventional photolithographic techniques. First, a gate electrode 13 is formed by stacking metal such as chromium or tantalum by sputtering on an electrically insulating substrate 12, such as a transparent glass substrate. A gate insulating film 14 made of silicon nitride, tantalum pentoxide, silicon dioxide or the like is formed over the entire area of one surface of the substrate 12 where the gate electrode 13 is formed. The gate insulating film 14 is provided for the purpose of electrically insulating the gate electrode 13 formed on the substrate 12 from a semiconductor layer to be described later and another bus line for the electrodes.

On the gate insulating film 14, a semiconductor layer 15 made of amorphous silicon or the like, which forms a channel of a thin film transistor, and a protective insulator film 16 made of silicon nitride or the like are consecutively stacked by the plasma CVD method. The protective insulator film 16 stacked at the top layer is formed into such a shape that only the part around the center on the semiconductor layer 15 remains after photo-etching or the like.

In order to form a source electrode and a drain electrode on the surface of the semiconductor layer 15 having both sides exposed so that the protective insulator film 16 is the boundary, n+ type semiconductor layers 17a and 17b of n+ amorphous silicon film or the like are made by doping phosphorus in amorphous silicon and are stacked by a plasma CVD method so that the layers oppose each other without making contact and are patterned together with the semiconductor layer 15. Therefore, a surface of the semiconductor layer 15 which does not face the gate insulating film 14 is completely covered with either the protective insulator film 16 or the n+ type semiconductor layers 17a and 17b. The stacked n+ type semiconductor layers 17a and 17b are formed together with the semiconductor layer 15 so that their peripheries are confined within the area on the gate electrode 13. A metal such as chromium, aluminum, titanium, molybdenum or the like is stacked on the n+ type semiconductor layers 17a and 17b by sputtering method to form a source electrode 18 and a drain electrode 19. Then a transparent conductive film made of indium tin oxide (ITO), for example, is stacked to form picture element electrodes 20 by sputtering.

When etching both the n+ semiconductor layers 17a and 17b and the semiconductor layer 15 simultaneously, the layers are formed in patterns with widths in the direction L smaller than the width of the gate electrode. Namely, the n+ semiconductor layers 17a and 17b and the semiconductor layer 15 are formed so that the widths L3 and L4 illustrated in a left to right direction of FIG. 7 satisfy the following inequality.

$$L3 < L4 \tag{3}$$

A thin film semiconductor device which has no part of the semiconductor layer 15 extending beyond the gate electrode 13 in the direction L (a left to right direction in FIG. 8) is thereby formed.

According to the construction of the thin film semiconductor device, the semiconductor layer 15 is shielded with the gate electrode 13 when viewing the thin film transistor from the side of the surface where the thin film transistor is not formed. Light irradiated from below in FIG. 8 is thereby cut off at the gate electrode 13 without reaching the semiconductor layer 15. As a result, the generation of carriers in the semiconductor layer 15 by optical excitation. and the off current due to the carriers generated by optical excitation can surely be reduced.

In the construction of the thin film semiconductor device, widths W4, W5 and W6 in the direction W (a vertical direction in FIG. 7) perpendicular to the direction where the n+ semiconductor layers 17a and 17b oppose each other, namely the width of the protective insulator film 16, the width of n+ semiconductor layers 17a and 17b, and the width of the source and drain electrodes 18 and 19 are selected to satisfy the following inequality.

$$W6 \geq W5 \geq W4 \tag{4}$$

In other words, W4 is the width of the channel region, W5 is the width of the contact region between the semiconductor layer and the n+ type semiconductor layer, and W6 is the width of both the source electrode and the drain electrode.

According to the above-mentioned construction, because the width W6 of the source and drain electrodes 18 and 19 is equal to or larger than the width W5 of the longest part of the semiconductor 15 in the direction W perpendicular to the direction where the n+ type semiconductor layers 17a and 17b are opposed to each other, no such area A as in the conventional art, where the electric field intensity in the direction between the source and the drain electrodes is weak, exists in the semiconductor layer 15. When the device is operated for a prolonged duration under the irradiation of light, even when carriers are generated in the semiconductor layer 15 due to the light irradiated and carried after irradiation, because the carriers are not accumulated, the probability of trapping the carriers into the gate insulating film is quite low. Namely, a shift in the gate-drain voltage Vgd vs, the drain current Id is negligibly small.

Figure 9:
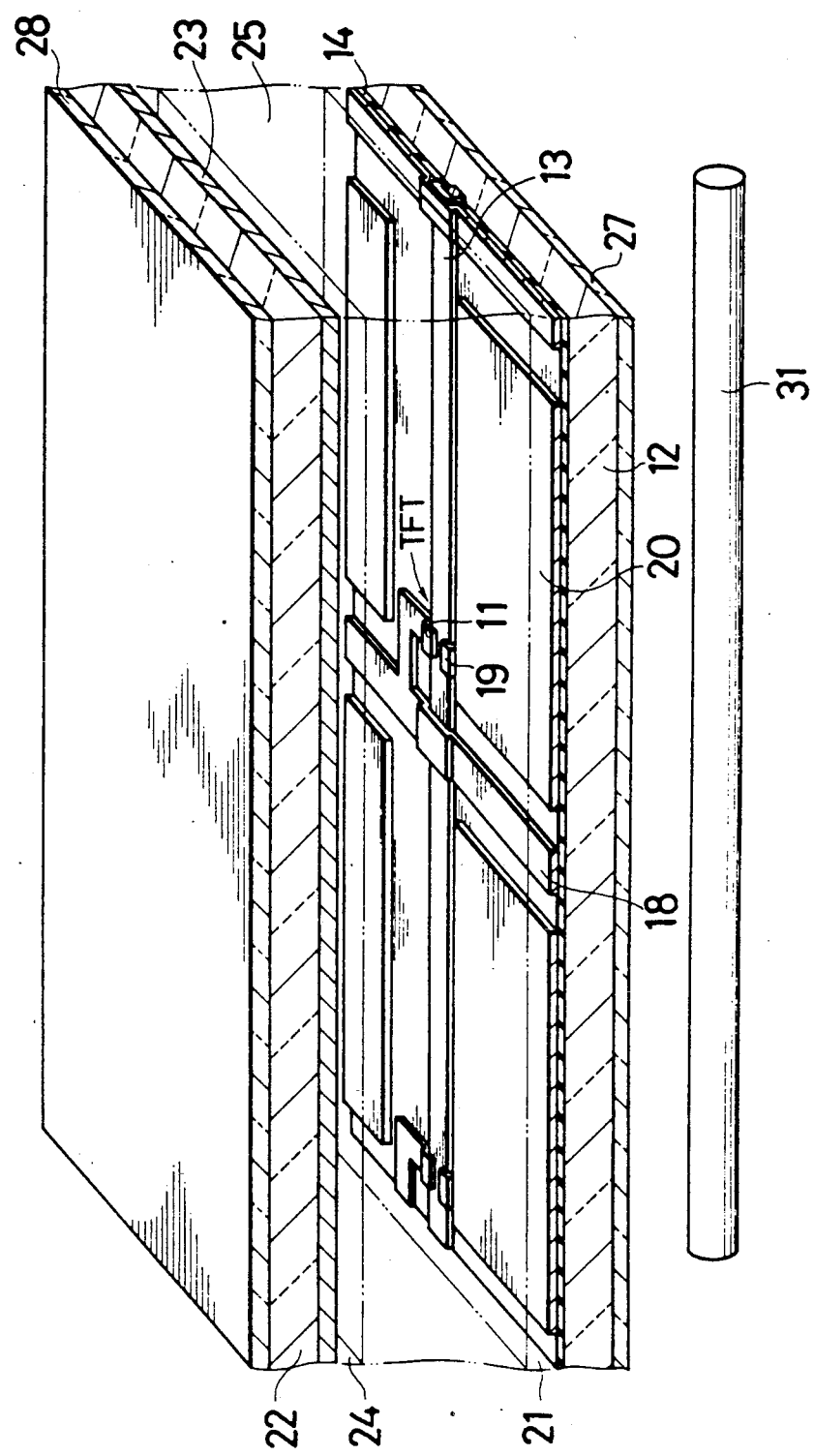
FIG. 9 is an oblique view of a cross section of a liquid crystal display section having a thin film semiconductor device of the present invention.
Figure 10:
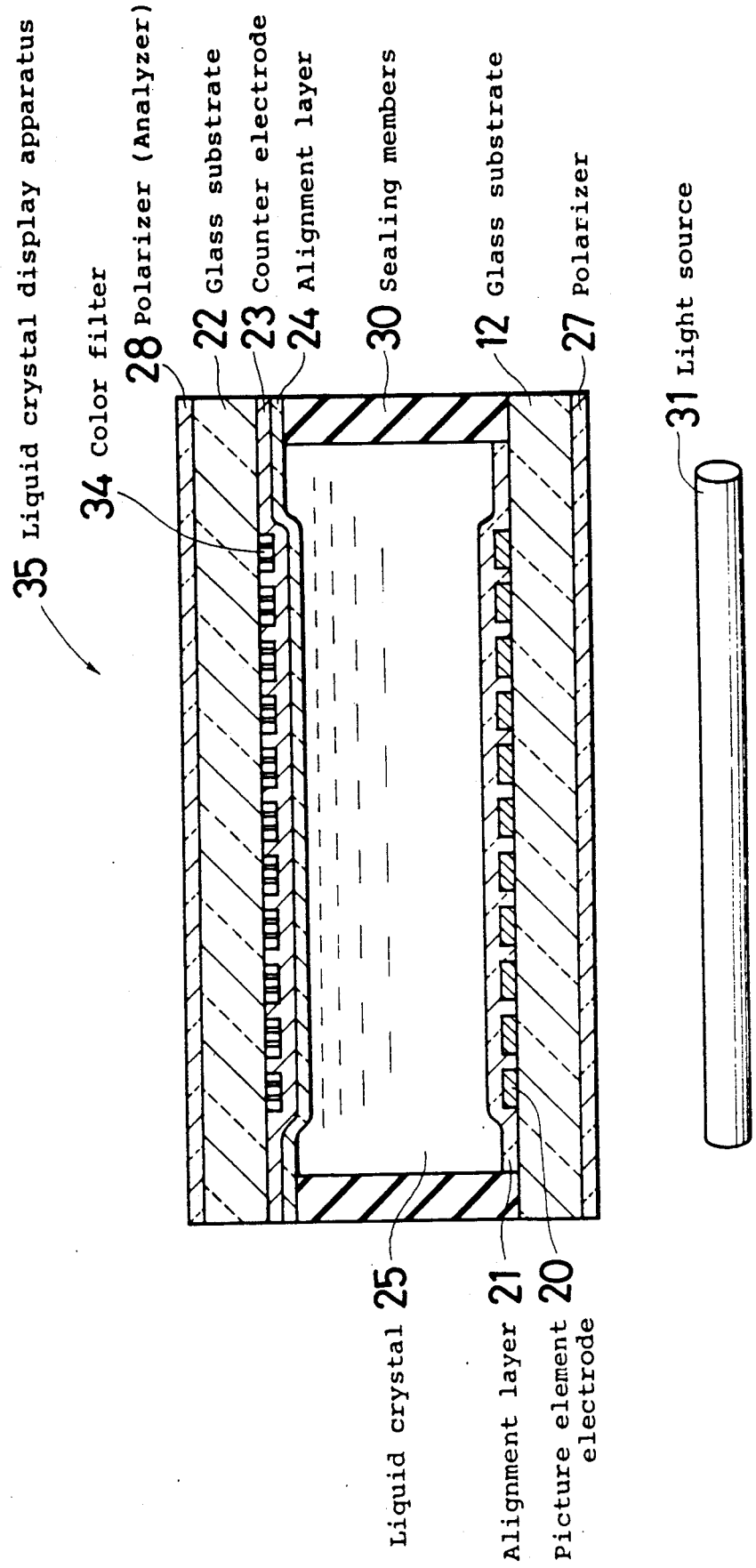
FIG. 10 is a cross-sectional view indicative of the simplified structure of an active matrix type liquid crystal display apparatus.

The thin film semiconductor device made in the construction previously described operates, for example, as a switching element of each picture element electrode in a liquid crystal display apparatus of an active matrix drive system. Referring to FIG. 9 and FIG. 10, a liquid crystal display apparatus provided with the thin film semiconductor device is explained as follows.

On one surface of one glass substrate 12 opposed to another glass substrate 22 is formed a gate electrode 13 which extends in left to right direction in a FIG. 9 at constant intervals, and a gate insulator film 14 is formed over the entire area of one surface of the substrate where the gate electrode 13 is formed. On the gate insulator film 14 is formed a source electrode 18 at constant intervals in the direction perpendicular to the gate electrode 13. Thin film transistors based on the construction of the thin film semiconductor device of the present embodiment are formed on the gate insulator film 14 which covers the gate electrode 13, corresponding to the vicinities of each intersection of the gate electrodes 13 and the source electrodes 18. The drain electrode 19 is connected to the picture element electrodes 20 in the thin film transistors. An alignment layer 21 is formed on the structure described above which is formed on the substrate 12 for the purpose of aligning of the molecular axis of the liquid crystal. On the other surface is arranged a polarizer 27.

On one surface of another glass substrate 22 opposed to the glass substrate 12 is formed a counter electrode 23 which extends in the left to right direction in FIG. 9, and an alignment layer 24 is formed on the surface where the counter electrode 23 is formed. Also, as illustrated in FIG. 10, a color filter 34 is arranged at the position of the substrate 12 which opposes the picture element electrode for the purpose of color display. Furthermore, on the other surface of the glass substrate 22 is arranged a polarizer 28 which is also called analyzer.

A liquid crystal display apparatus 35 is constructed by opposing the glass substrates 12 and 22, and filling the space between the alignment layer 21 and 24 and sealing members 30 which support the glass substrates with liquid crystal 25. The liquid crystal display apparatus 35 is indicated as a transmission type liquid display apparatus in this embodiment, and a light source 31 is provided outside of one polarizer 27 (a bottom side in FIG. 9 and FIG. 10).

Figure 11:
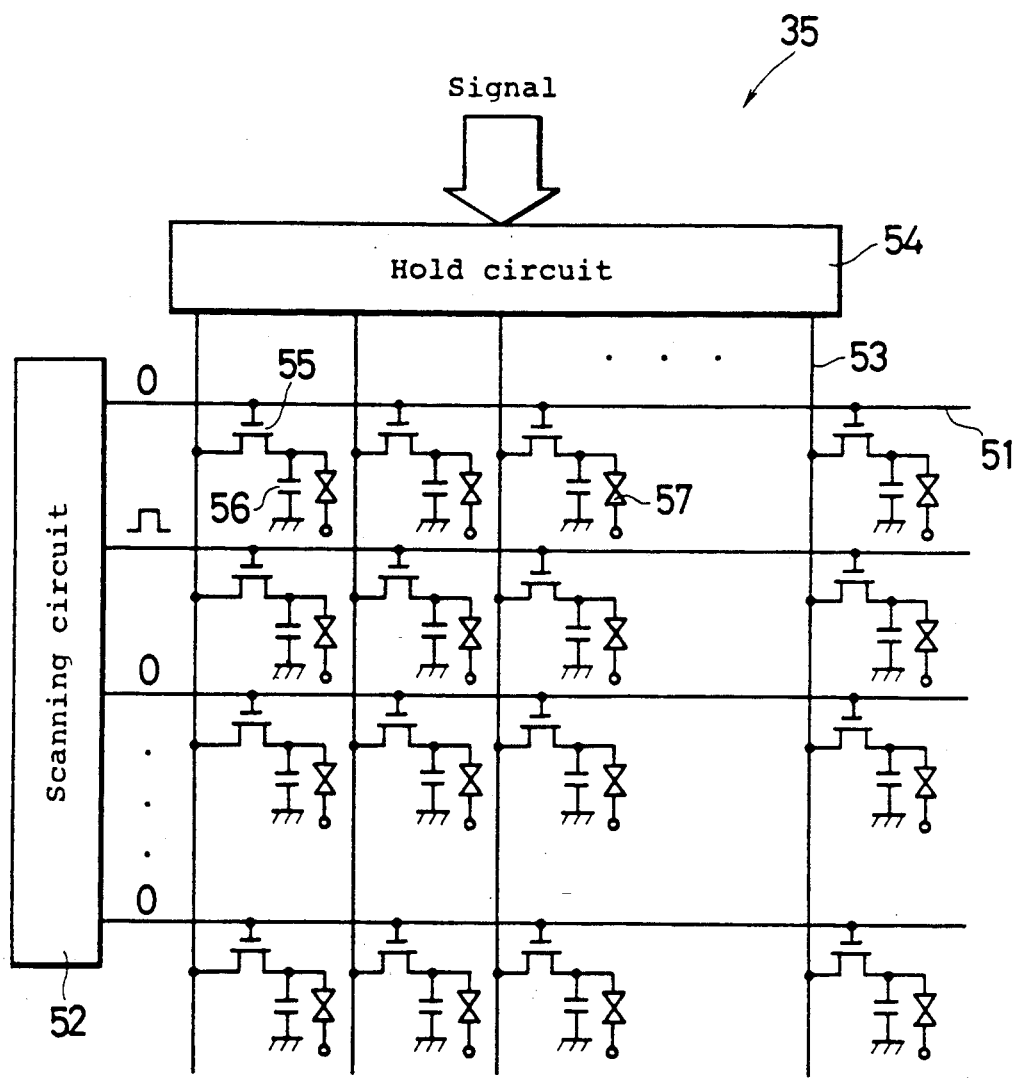
FIG. 11 is a drawing for the explaining the operating principles of an active matrix type liquid crystal display apparatus.

FIG. 11 illustrates the operating principle of the liquid crystal display apparatus of an active matrix drive system, which is provided with signal storage elements, using thin film transistors as the switching elements. In this figure, the liquid crystal display apparatus 35 includes a scanning circuit 52 which is connected to a gate bus 51, a hold circuit 54 which supplies display signals, a thin film transistor 55 which operates as a switching element and is provided at each intersection of a matrix having a gate bus and a source bus, a signal storage capacitor 56 to hold the display signals, and a liquid crystal display element 57. The liquid crystal display apparatus scans the scanning electrodes of the gate bus 51 in order by a line sequential procedure, turns on all the thin film transistors 55 on one gate bus 51 simultaneously, and supplies display signals to each of the signal storage capacitors 56 from the hold circuit 54 via the source bus 53. The supplied display signal is capable of exciting the liquid crystal until the next frame is actuated.

A display operation of the liquid crystal display apparatus for the active matrix drive system as described above will be briefly explained as follows by using the twisted nematic mode and the normally white mode as examples.

Under a condition where no voltage is applied to the liquid crystal 25, crystal molecules of the liquid crystal 25 are oriented in the twisted nematic state by the alignment layers 21 and 24. Polarizing directions of polarizers 27 and 28 are so arranged that light irradiated by a light source 31 is polarized in the predetermined direction and transmitted through the liquid crystal by exiting to the outside. However, when a predetermined voltage Vw is applied to the gate electrode 13 of the thin film transistor via the gate bus lines 51, carriers are accumulated in the semiconductor layer 15 above the gate electrode 13, and the source electrode 18 and the drain electrode 19 conduct. Because the source electrode 18 is always provided with the voltage of the display signal via the source bus line 53, voltage is applied to the picture element electrode 20 by turning on the thin film transistor. An electric field is therefore between the picture element electrode 20 and the counter electrode 23 which an opposed to each other with the liquid crystal 25 interposed therebetween. Consequently, orientation of the liquid crystal molecules of the liquid crystal 25 is changed by the electric field and the polarization direction of the incident light from the light source 31 is made to be different from the polarization direction of the polarizer 28, and is made not to transmit to the outside. When this display operation is viewed from the display side, namely from the top in FIG. 10, the picture element is put into a dark condition when the display signal voltage stored in the storage capaciter 56 and applied to the liquid crystal is greater than a threshold voltage of the liquid crystal. Otherwise the picture element is put into a transparent condition for providing color display corresponding to the color of the color filter 34. With this principle, by individually operating a very large number of picture elements arranged in a matrix over the entire display surface, desired images or information can be displayed.

According to the thin film semiconductor device of the above-mentioned construction, the off current can be substantially reduced. The liquid crystal display apparatus which uses the thin film semiconductor device as a switching element is capable of greatly improving the quality because such deteriorations of the display quality by degradation of contrast and uniformity can be avoided.

Although the description of the above embodiment is directed to transmission type liquid crystal display apparatus, the present invention may be also applicable to a reflection type liquid display apparatus. In a reflection type liquid crystal display apparatus, the intensity of light irradiated to the thin film transistor is generally made low. Namely, by coating the side of the substrate where the thin film transistor is not formed with an opaque material of a matrix state called the black matrix at the position opposing the thin film transistor, light irradiated to the thin film transistor is substantially cut off. As a result the light is prevented from reaching the semiconductor layer and generation of carriers due to optical excitation does not occur.

Although the description of the embodiments of the invention deals with the thin film semiconductor device used in a liquid crystal display apparatus, the thin film semiconductor device may be used in an apparatus other than a liquid crystal display apparatus.

Although the n+ type semiconductor layers 17a and 17b are made by doping phosphorus in an amorphous silicon film in the present embodiment, n+ type semiconductor layers 17a and 17b may be made by doping arsenic in an amorphous silicon film. A p+ type semiconductor layer formed by doping boron in an amorphous silicon film may also be used in the thin film transistor.

Figure 1:
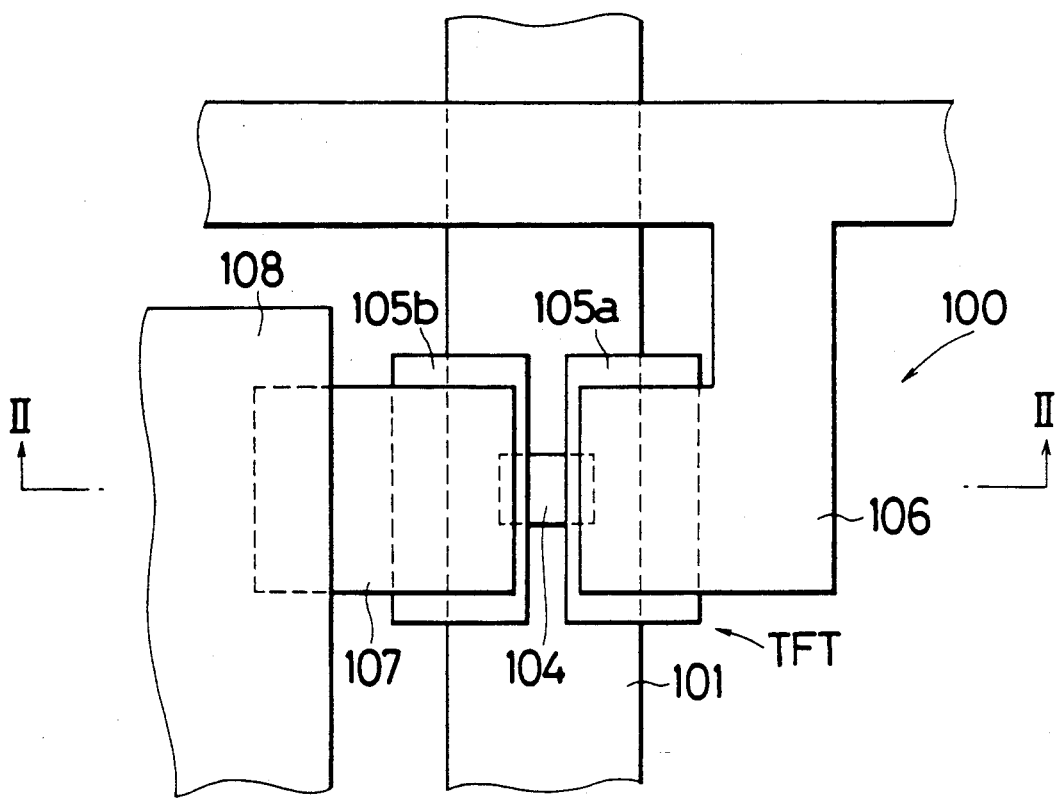
FIG. 1 is a plan view of a conventional thin film semiconductor device 100.
Figure 2:
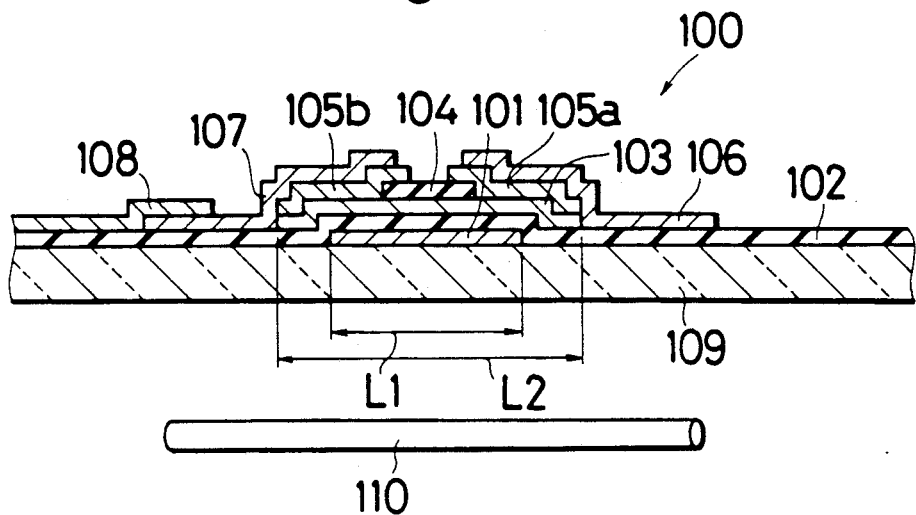
FIG. 2 is a cross-sectional view taken along a line II—II of FIG. 1.
Figure 3:
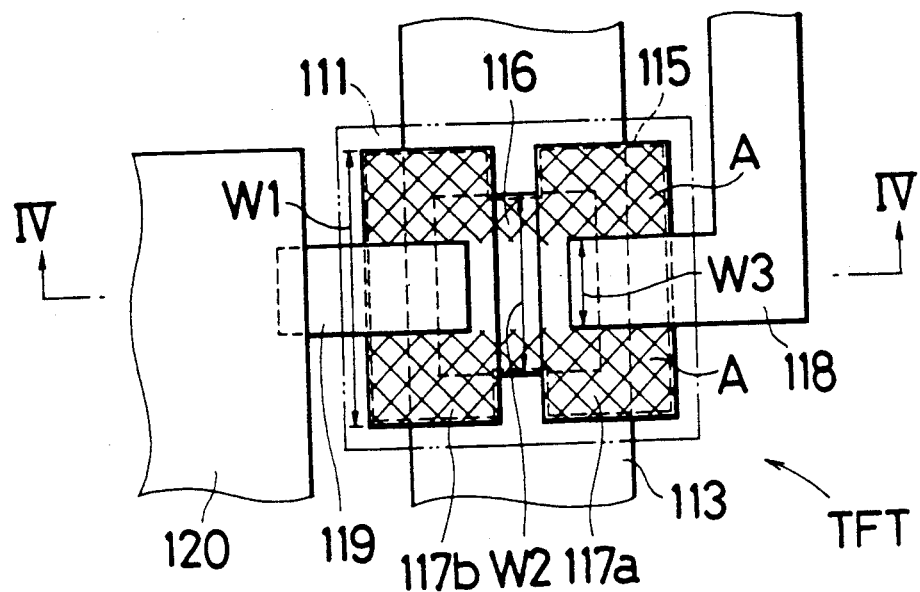
FIG. 3 is a plan view of another conventional thin film semiconductor device.
Figure 4:
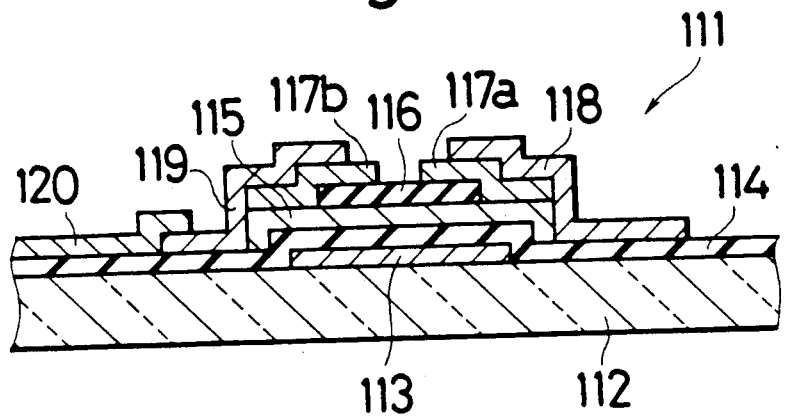
FIG. 4 is a cross-sectional view taken a line IV—IV of FIG. 3.
Figure 5:
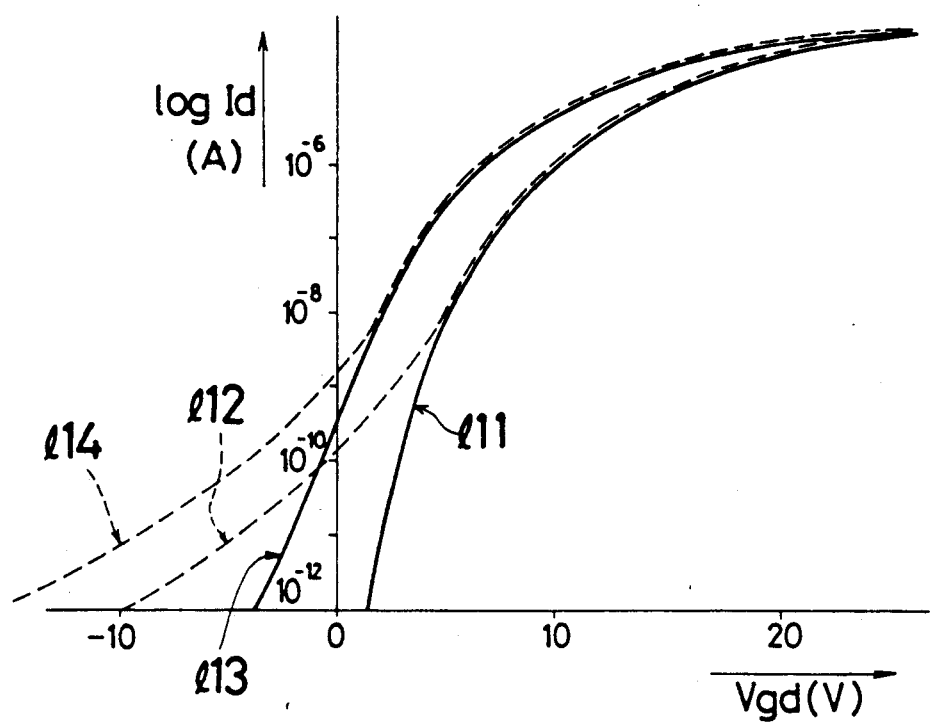
FIG. 5 is a graph for illustrating the gate-drain voltage Vgd vs. the drain current Id characteristic.
Figure 6:
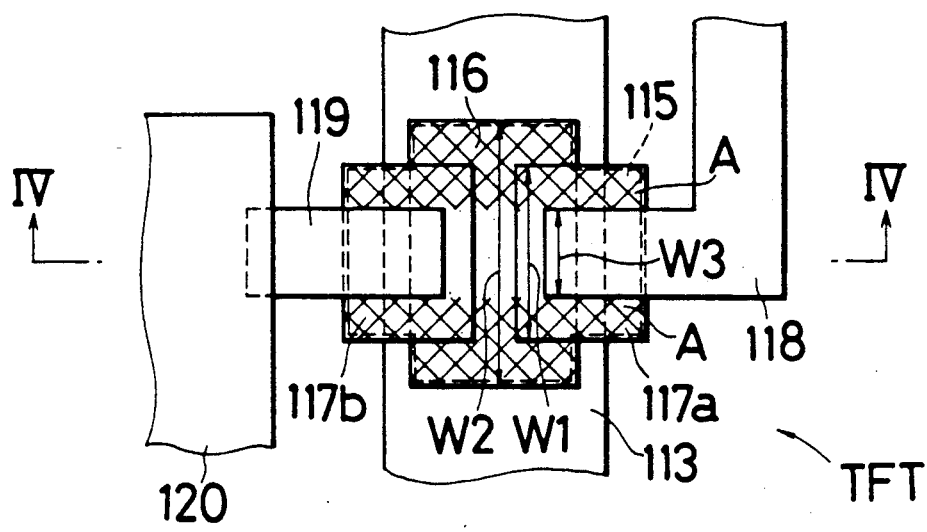
FIG. 6 is a plan view of another conventional thin film semiconductor device.

In the above-mentioned embodiment, the width W5 of the n+ type semiconductor layers 17a and 17b in the direction W perpendicular to the direction L where the n+ semiconductor layers 17a and 17b are opposed to each other, namely the width of the contact region between the semiconductor layer and the n+ type semiconductor layer is selected to be equal to or larger than the width W4 of the protective insulator film 16, namely the width of the channel region in the semiconductor layer in the direction W. Even when the semiconductor layer 15 is formed into a cross shape, such as the semiconductor layer 115 of FIG. 6, and the width W4 of the protective insulator film 16 (the width of the channel region) the direction W is made larger than the width W5 of the n+ type semiconductor layers 17a and 17b (the width of the contact region) in the direction W, the same result as in the above-mentioned embodiment can be obtained by making the width W6 of the source and drain electrodes 18 and 19 in the direction W larger than both the width W4 and the width W5.

The invention may also be embodied in a variety of ways other than those preferred embodiments cited above without departing from the spirit, scope, or essential features of the invention. Therefore, those preferred embodiments cited above are merely illustrative examples. The scope of the invention is explicitly manifested in the following claims, and thus, the content of the foregoing description does not bind the scope of the invention, but any modification or alteration falling under the spirit and scope of the invention shall fully be embraced in the scope of the invention itself.

What is claimed is:

1. A thin film semiconductor device comprising:
    an electrically insulating substrate;
    a conductor layer formed on a portion of a first surface of said insulating substrate;
    a first insulator layer formed on said conductor layer and said insulating substrate;
    a first semiconductor layer formed on a portion of said first insulator layer having a first width;
    a second insulator layer formed on a portion of said first semiconductor layer having a second width less than said first width;
    a second semiconductor layer formed on a portion of said second insulator layer having said first width; and
    a pair of electrodes formed over the surface of the device having a third width greater than said first and second widths.

2. A thin film semiconductor device of claim 1 wherein said pair of electrodes are separated by a space formed on said second semiconductor layer.

3. A thin film semiconductor device of claim 1 wherein said pair of electrodes comprise a source electrode and a drain electrode and said conductor layer comprises a gate electrode for forming the thin film transistor.

4. A thin film semiconductor device comprising:
    a substrate formed of an electrically insulating material and having optical transparency;
    a light-excluding metal layer formed on a portion of a first surface of said substrate and having an elongated shape extending in a first direction;
    a first insulator layer formed on said light-excluding metal layer and the remainder of said substrate from said portion of said first surface of said substrate;
    a first semiconductor layer disposed over said light-excluding layer and formed on a first portion of said first insulator layer having a first width;
    a second insulator layer formed on said first semiconductor layer in a rectangular shape being formed to have opposing ends of said rectangular shape in a second direction perpendicular to said first direction leaving corresponding edges of said first semiconductor layer uncovered;
    a pair of second semiconductor layers formed at the opposing ends of said rectangular shape on a portion of said second insulator layer and the corresponding edges of said first semiconductor layer left uncovered, said pair of second semiconductor layers having a second width greater than said first width; and
    a pair of metal electrodes formed on said pair of second semiconductor layers and said first insulator layer respectively to extend in said second direction.

* * * * *